United States Patent
Sauers et al.

(10) Patent No.: US 10,170,711 B2
(45) Date of Patent: Jan. 1, 2019

(54) DISPLAY WITH VIAS TO ACCESS DRIVER CIRCUITRY

(71) Applicant: Apple Inc., Cupertino, CA (US)

(72) Inventors: Jason C. Sauers, Cupertino, CA (US); Jean-Pierre S. Guillou, San Francisco, CA (US); Peter J. Kardassakis, Mountain View, CA (US); Shaowei Qin, Milpitas, CA (US); Yi Tao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 103 days.

(21) Appl. No.: 15/091,333

(22) Filed: Apr. 5, 2016

(65) Prior Publication Data

US 2016/0329386 A1    Nov. 10, 2016

Related U.S. Application Data

(60) Provisional application No. 62/157,198, filed on May 5, 2015.

(51) Int. Cl.
| | | |
|---|---|---|
| *H01L 27/32* | (2006.01) | |
| *H01L 51/00* | (2006.01) | |
| *H01L 51/56* | (2006.01) | |

(52) U.S. Cl.
CPC ...... *H01L 51/0097* (2013.01); *H01L 27/3276* (2013.01); *H01L 51/56* (2013.01)

(58) Field of Classification Search
CPC .. H01L 51/0097; H01L 27/3276; H01L 51/56
See application file for complete search history.

(56) References Cited

U.S. PATENT DOCUMENTS

| | | | |
|---|---|---|---|
| 6,617,177 B1 | 9/2003 | Winer | |
| 7,459,351 B2 * | 12/2008 | Chen | H01L 27/3248 438/149 |
| 7,791,700 B2 | 9/2010 | Bellamy | |
| 7,977,170 B2 | 7/2011 | Tredwell et al. | |
| 7,994,714 B2 | 8/2011 | Cok et al. | |
| 8,169,588 B2 | 5/2012 | Oikawa et al. | |
| 8,258,523 B2 | 9/2012 | Lee et al. | |

(Continued)

FOREIGN PATENT DOCUMENTS

| | | |
|---|---|---|
| EP | 2141573 | 6/2010 |
| EP | 2418537 | 2/2012 |
| WO | 2006106365 | 10/2006 |

*Primary Examiner* — Peter Bradford
(74) *Attorney, Agent, or Firm* — Treyz Law Group, P.C.; G. Victor Treyz; David K. Cole

(57) ABSTRACT

A thin-film transistor layer, an organic light-emitting diode layer, and other layers may be used in forming an array of pixels on a substrate in a display. Vias may be formed through one or more layers of the display such as the substrate layer to form vertical signal paths. The vertical signal paths may convey signals between display driver circuitry underneath the display and the pixels. The vias may pass through a polymer layer and may contact pads formed within openings in the substrate. Vias may pass through a glass support layer. Metal traces may be formed in the thin-film transistor layer to create signal paths such as data lines and gate lines. Portions of the metal traces may form vias through a polymer layer such as a substrate layer or a polymer layer that has been formed on top of the substrate layer.

11 Claims, 13 Drawing Sheets

(56) References Cited

U.S. PATENT DOCUMENTS

| | | |
|---|---|---|
| 8,362,488 B2 | 1/2013 | Chaug et al. |
| 9,226,347 B2 | 12/2015 | Weber et al. |
| 9,286,826 B2 | 3/2016 | Wright et al. |
| 2004/0021139 A1* | 2/2004 | Jackson ............ H01L 21/76898 257/40 |
| 2005/0156509 A1* | 7/2005 | Yamazaki ............ G01N 33/497 313/498 |
| 2007/0002009 A1 | 1/2007 | Pasch et al. |
| 2007/0080360 A1 | 4/2007 | Mirsky et al. |
| 2007/0252145 A1* | 11/2007 | Toyota ................ H01L 29/4908 257/59 |
| 2009/0278452 A1 | 11/2009 | Kim |
| 2010/0259166 A1 | 11/2010 | Cok et al. |
| 2010/0315570 A1 | 12/2010 | Mathew et al. |
| 2011/0050657 A1* | 3/2011 | Yamada ............ H01L 27/3293 345/204 |
| 2011/0204403 A1 | 8/2011 | Kim et al. |
| 2012/0235969 A1 | 9/2012 | Burns et al. |
| 2012/0319304 A1 | 12/2012 | Pressel et al. |
| 2013/0002685 A1 | 1/2013 | Shenoy et al. |
| 2013/0082984 A1* | 4/2013 | Drzaic .................... G09G 3/20 345/204 |
| 2013/0088671 A1 | 4/2013 | Drzaic et al. |
| 2013/0107476 A1* | 5/2013 | Wright ................ G09G 3/3208 361/752 |
| 2013/0342099 A1 | 12/2013 | Weber et al. |
| 2014/0049522 A1* | 2/2014 | Mathew ............. H05B 33/0896 345/204 |
| 2014/0063393 A1 | 3/2014 | Zhong et al. |
| 2014/0183473 A1* | 7/2014 | Lee .................... H01L 51/0097 257/40 |
| 2014/0203703 A1* | 7/2014 | Maatta ................ H01L 23/3121 313/504 |
| 2015/0286318 A1 | 10/2015 | Morein et al. |
| 2016/0021746 A1 | 1/2016 | Wright et al. |

* cited by examiner

DISPLAY WITH VIAS TO ACCESS DRIVER CIRCUITRY

This application claims the benefit of provisional patent application No. 62/157,198 filed on May 5, 2015, which is hereby incorporated by reference herein in its entirety.

BACKGROUND

This relates generally to electronic devices with displays, and, more particularly, to displays with minimized inactive border regions.

Electronic devices often include displays. Displays include arrays of pixels that emit light to display images for a user. The borders of displays often contain signal routing traces and display driver circuitry for controlling the pixels. Excessive border width can be unsightly and can undesirably enlarge the size of a display.

It would therefore be desirable to be able to provide displays with minimized inactive border regions.

SUMMARY

A display may have an array of pixels that form an active area on a substrate. The pixels may be formed from organic light-emitting diodes. Display driver circuitry for the array of pixels may be located below the backside of the substrate and may be overlapped by the active area of the display.

The substrate may include a polymer. A thin-film transistor layer, an organic light-emitting diode layer, and other layers may be used in forming an array of pixels on the substrate. Vias may be formed through one or more layers of the display such as the substrate layer to form vertical signal paths. The vertical signal paths may convey signals between display driver circuitry underneath the display and the pixels without needing to bend the edge of the display. The vias may pass through a polymer layer and may contact metal pads. The metal pads may be formed in openings in the polymer substrate. Display structures may be formed on a temporary glass support layer or the glass support layer may be retained and vias may be formed through the glass support layer. Metal traces may be formed in the thin-film transistor layer to create signal paths such as data lines and gate lines. Portions of the metal traces may form vias through a polymer layer such as a substrate layer or a polymer layer that has been formed on top of the substrate layer.

A display may have a polymer substrate that is supported on the temporary glass support layer during manufacturing. After forming vias through the substrate to create vertical signal paths, the polymer substrate may be released from the glass layer. Laser light may be applied to the polymer layer through the glass layer to help release the polymer layer.

Vias for the display may be formed using laser drilling, etching, or other fabrication techniques. Metal for filling the vias may be deposited using physical vapor deposition, electroplating, printing techniques, or other conductive material patterning techniques. One or more layers of metal may be deposited into via openings when forming the vias.

A display may have a semiconductor substrate such as a silicon substrate. A layer of circuitry may be formed on the upper surface of the silicon substrate. The circuitry may include transistors and other circuit elements for forming display driver circuitry for the display. Metal signal lines may be formed in an interlayer dielectric layer on the silicon substrate. An organic light-emitting diode layer may be formed on the silicon substrate and may receive signals from metal interconnect lines in the interlayer dielectric layer. The organic light-emitting diode layer may form light-emitting diodes for an array of pixels. The pixels may be controlled using transistors in the display driver circuitry.

DETAILED DESCRIPTION

Figure 1:
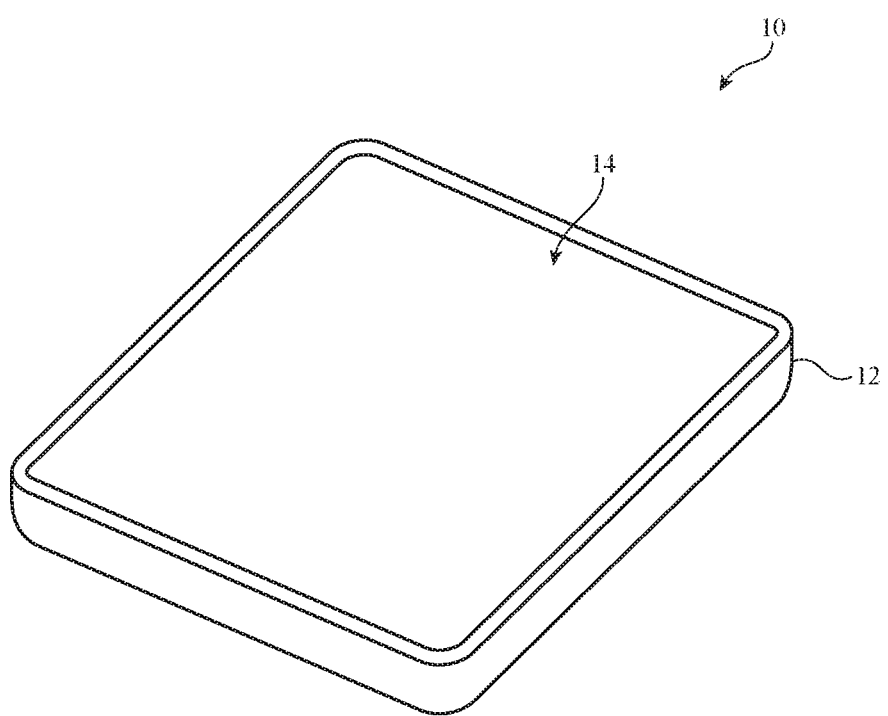
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. Configurations in which display 14 is an organic light-emitting diode display are sometimes described herein as an example. The use of organic light-emitting diode pixels to form display 14 is merely illustrative. Display 14 may, in general, be formed using any suitable type of pixels. The array of pixels in display 14 may form an active area of display 14 in which images are displayed for a user. In some configurations, display 14 may be borderless and may not be surrounded by any inactive areas. In other configurations, the active area may be surrounded on one or more sides by inactive border regions. The widths of these inactive border regions may be minimized to enhance device aesthetics and to provide enhanced viewing area for a user.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
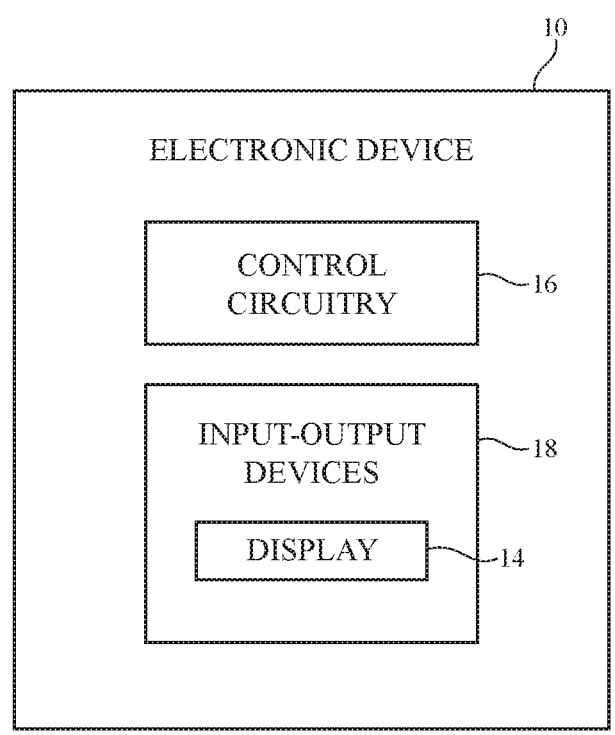
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3:
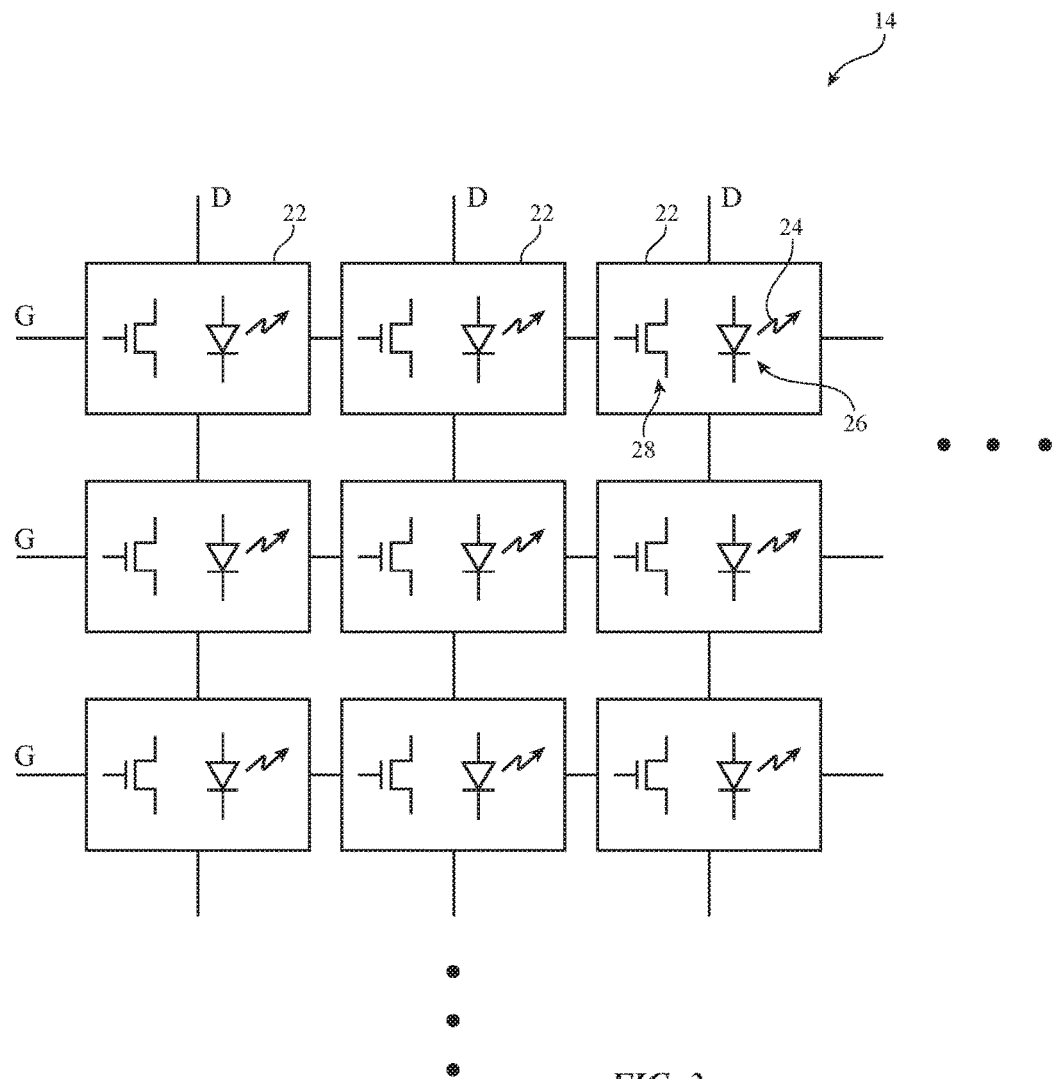
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from transistor circuitry such as thin-film transistors 28 and thin-film capacitors). Transistors 28 may be polysilicon thin-film transistors, semiconducting-oxide thin-film transistors such as indium gallium zinc oxide transistors, or transistors formed from other semiconductors.

Figure 4:
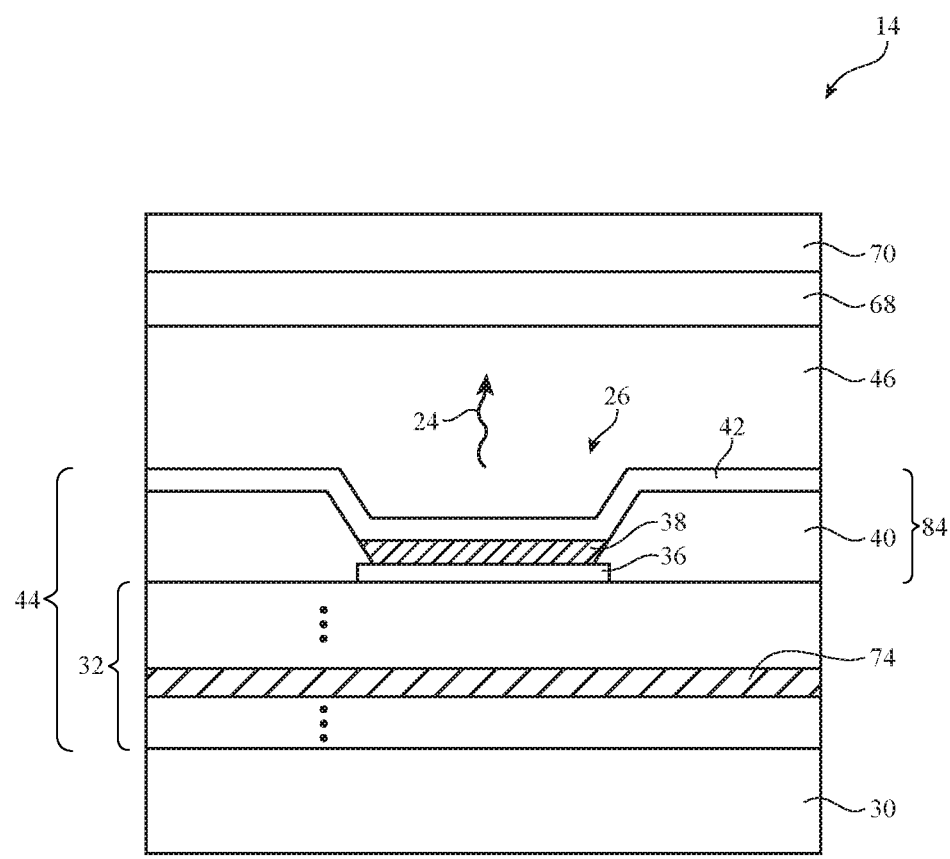
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from a polymer or other suitable materials. Configurations for display 14 in which substrate 30 has been formed from a flexible material such as polyimide or other flexible polymer materials are sometimes described herein as an example.

Thin-film transistor circuitry 44 may be formed on substrate 30. Thin film transistor circuitry 44 may include layers 32. Layers 32 may include inorganic layers such as inorganic buffer layers, barrier layers (e.g., barrier layers to block moisture and impurities), gate insulator, passivation, interlayer dielectric, and other inorganic dielectric layers. Layers 32 may also include organic dielectric layers such as a polymer planarization layer. Metal layers and semiconductor layers may also be included within layers 32. For example, semiconductors such as silicon, semiconducting-oxide semiconductors, or other semiconductor materials may be used in forming semiconductor channel regions for thin-film transistors 28. Metal in layers 32 such as metal traces 74 may be used in forming transistor gate terminals, transistor source-drain terminals, capacitor electrodes, and metal interconnects.

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 40. Pixel definition layer 40 may be formed from a patterned photoimageable polymer such as polyimide.

In each light-emitting diode, organic emissive material 38 and other light-emitting diode layers may be interposed between a respective anode 36 and cathode 42. Anodes 36 may be patterned from a layer of metal. Cathode 42 may be formed from a common conductive layer that is deposited on top of pixel definition layer 40. Cathode 42 is transparent so that light 24 may exit light emitting diode 26. During operation, light-emitting diode 26 may emit light 24.

If desired, the anode of diode 26 may be formed from a blanket conductive layer such as layer 42 and the cathode of diode 26 may be formed form a patterned conductive layer such as layer 36. The illustrative configuration of display 14 allows light 24 to be emitted from the top of display 14 (i.e., display 14 is a "top emission" display). Display 14 may be implemented using a bottom emission configuration if desired. Layers such as layers 36, 38, and 42 are used in forming organic light-emitting diodes such as diode 26 of FIG. 4, so this portion of display 14 is sometimes referred to as an organic light-emitting diode layer (see, e.g., layer 84 of FIG. 4).

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74 (e.g., traces 74 may be used in forming data lines D, gate lines G, power supply lines, clock signal lines, and other signal lines).

If desired, display 14 may have a protective outer display layer such as cover glass layer 70. The outer display layer may be formed from a material such as sapphire, glass, plastic, clear ceramic, or other transparent material. Protective layer 46 may cover cathode 42. Layer 46, which may sometimes be referred to as an encapsulation layer, may include moisture barrier structures, encapsulant materials such as polymers, adhesive, and/or other materials to help protect thin-film transistor circuitry.

Functional layers 68 may be interposed between layer 46 and cover layer 70. Functional layers 68 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as layer 46, thin-film transistor circuitry 44, and substrate 30.

Display 14 may have an active area in which pixels 22 form images for viewing by a user of device 10. The active area may have a rectangular shape. Inactive portions of display 14 may surround the active area. For example, signal traces and other support circuitry such as thin-film display driver circuitry may be formed along one or more of the four edges of display 14 that run around the rectangular periphery of display 14 adjacent to the active area. If desired, some or all of the signal traces, thin-film transistor circuitry, and/or other support circuitry (e.g., signal distribution paths for gate lines G, data lines D, and/or display driver circuitry) may be mounted under substrate 30. For example, support circuitry may be mounted under display 14 so that so that some or all of the support circuitry is overlapped by active area AA of display 14. Signals associated with this support circuitry may be routed to and from the circuitry of active area AA of display 14 (e.g., pixels 22) using vias that pass through substrate 30. The vias include metal or other conductive material that forms signal paths through display 14 (e.g., metal that forms part of or is connected to metal traces 74).

Figure 5:
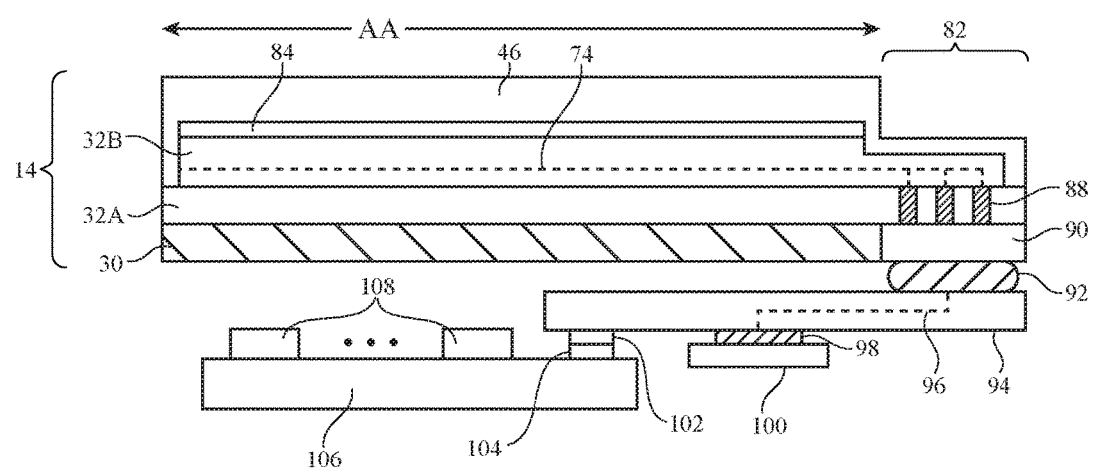
FIG. 5 is a cross-sectional side view of an illustrative display having vias that form signal paths to display driver circuitry mounted under the display in accordance with an embodiment.

A cross-sectional side view of display 14 in a configuration in which support circuitry has been mounted below display 14 is shown in FIG. 5. As shown in FIG. 5, display 14 includes substrate 30. Substrate 30 may be formed from a polymer such as polyimide or other flexible polymer. Thin-film transistor circuitry layer 32 of FIG. 4 has been formed using dielectric layer 32A and thin-film transistor circuitry 32B of FIG. 5. Dielectric layer 32A may be a layer of polymer (e.g., polyimide, etc.) and/or other dielectric layer(s) formed on substrate 30. Layer 32B may have a thinned edge region such as region 82 (e.g., a region in which only metal traces such as metal traces 74 are present and transistor active areas and other transistor circuitry are no present). Organic light-emitting diode layer 84 may be formed on layer 32B. Encapsulant 46 may be used to encapsulate organic light-emitting diode layer 84.

Layer 32A may contain vias such as vias 88. Vias 88 may include metal that is coupled to metal traces 74 or that forms part of metal traces 74. One or more layers of metal traces may be deposited into via openings when forming vias 88 (e.g., to ensure that sufficient metal is present to form a satisfactory signal path).

Metal pads 90 may be coupled to vias 88. In the example of FIG. 5, metal pads 90 are exposed on the lower surface of display 14, so that support circuitry that lies under active area AA of display 14 such as display driver integrated circuit 100 may be coupled to metal pads 90.

Display driver integrated circuit 100 may be mounted on a rigid or flexible printed circuit such as flexible printed circuit 94 using solder 98. Flexible printed circuit 94 contains metal traces 96. Metal traces 96 may form metal contacts (pads) that are coupled to pads 90 using conductive bonding material 92. Conductive material 92 may be anisotropic conductive film or other conductive adhesive, solder, or other conductive bonding material. If desired, inductors, capacitors, resistors, and other electrical components may be mounted on flexible printed circuit 94.

In the example of FIG. 5, a connector such as connector 102 on flexible printed circuit 94 has been coupled to mating connector 104 on printed circuit 106. Printed circuit 106 may be a rigid printed circuit formed from fiberglass-filled epoxy or other rigid printed circuit board material or may be a flexible printed circuit formed from a flexible polymer substrate such as a sheet of polyimide or other flexible polymer. Electrical components 108 (e.g., control circuitry 16, input-output devices 18, etc.) may be mounted on printed circuit 106 and/or printed circuit 94. Printed circuit 106 may be, for example, a main logic board in device 10.

With an arrangement of the type shown in FIG. 5, display driver circuitry such as display driver circuitry 100 may be located below display 14 and may be overlapped by active area AA of display 14 (when viewed from above). As a result, display driver circuitry 100 does not add to the inactive border of display 14, allowing the inactive border of device 10 (e.g., area 82 in the example of FIG. 5) to be minimized. Vias such as vias 88, bond pads 90, and other conductive structures for forming vertical signal paths through display 14 to help minimize the inactive border of display 14 may be formed using photolithographic patterning techniques and other fabrication techniques.

Figure 6:
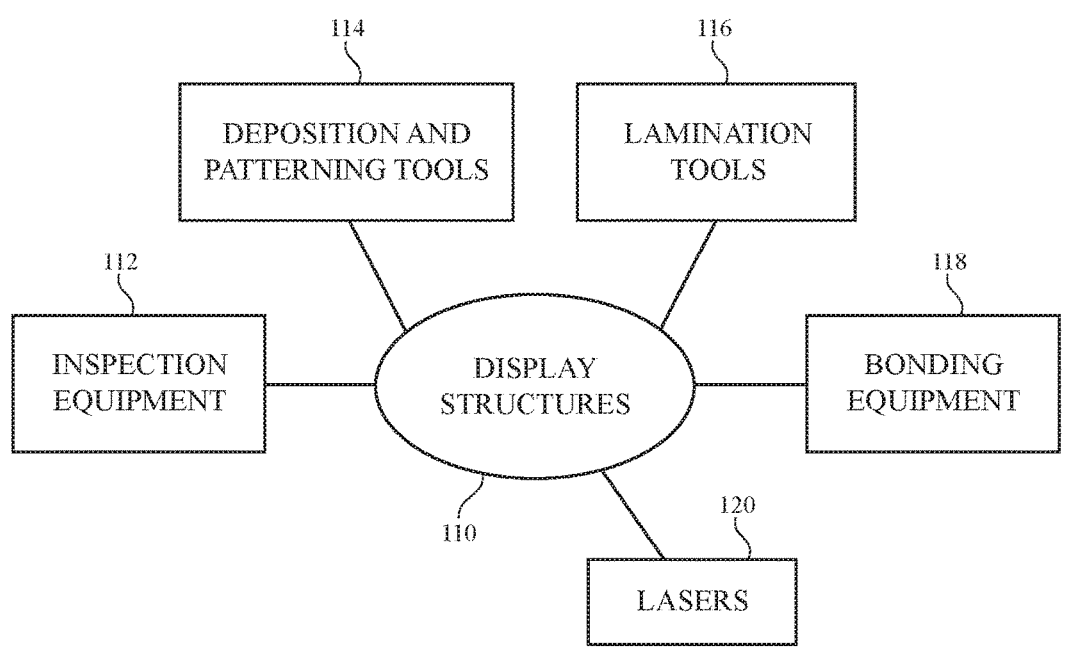
FIG. 6 is a diagram of illustrative equipment that may be used in fabricating displays in accordance with an embodiment.

Illustrative equipment for fabricating display 14 is shown in FIG. 6. As shown in FIG. 6, display structures 110 (e.g., layer of material and other portions of display 14) may be processed using inspection equipment 112, deposition and patterning tools 114, lamination tools 116, bonding equipment 118, lasers 120, and other equipment.

Deposition and patterning tools 114 may be used in depositing and patterning layers of material such as inorganic and organic dielectric layers, semiconductor layers, metal layers and other conductive layers, protective layers, and other structures for display 14. Deposition equipment in tools 114 may include physical vapor deposition equipment, chemical vapor deposition equipment, electrochemical deposition equipment (e.g., electroplating tools), atomic layer deposition equipment, screen printing equipment, pad printing equipment, equipment for spraying material, equipment for applying material by dripping (e.g., spin deposition equipment), a tool for dispensing material using a needle, a slit coating tool, ink-jet printing equipment, and other material deposition equipment. Some deposition equipment may pattern material as part of the deposition process. For example, deposition by an ink-jet printer, screen printing, or deposition through a shadow mask may create patterned areas of deposited material (as examples). Other deposition equipment may deposit blanket films of material that are patterned during subsequent patterning operations with separate patterning equipment. Patterning equipment in tools 114 may include cutting tools (e.g., laser cutting tools, blade cutting tools, rotating wheel cutting tools, etc.), etching tools (e.g., a plasma etcher, a tool for reactive ion etching, a tool for laser etching, wet chemical etching equipment), photolithographic patterning tools (e.g., a mask aligner or other tool for patterning photoresist to form masks such as etch masks, developing equipment, etc.), equipment for machining metal and other structures, drilling equipment (e.g., laser drilling tools such as laser ablation equipment, mechanical drilling tools, etc.), heated pins for pressing through polymers and other materials to form holes, and other suitable equipment.

Inspection equipment 112 may include manually controlled and/or automated equipment for inspecting structures 110 in connection with forming display 14. Equipment 112 may include optical inspection equipment, visible light inspection equipment, infrared light inspection equipment, X-ray inspection equipment, equipment that uses microscopes and other optical equipment to gather images of structures 110, and equipment that digitizes images so that digitized image data may be used in automatically aligning and otherwise processing structures 110. Equipment 112 may include machine vision equipment that digitally captures images of structures 110 using optical camera equipment, X-ray camera equipment, or other image sensor. Information gathered on structures 110 using a machine vision system or other inspection equipment may be used by the other equipment of FIG. 6 in processing structures 110.

For example, machine vision data from equipment 112 may be used to align metal traces 96 of flexible printed circuit 94 (e.g., bond pads on flexible printed circuit 94) with metal pads 90 in display 14.

Lamination tools 116 may be used to attach display layers together. Tools 116 may, for example, be used in attaching function layers 68 and/or display cover layer 70 to the other layers of display 14. Adhesive may be used in attaching layers together. Tools 116 may use heat and pressure when joining layers of display 14.

Bonding equipment 118 may include equipment for forming conductive bonds such as soldering and welding equipment, equipment for forming anisotropic conductive adhesive bonds, or other equipment for coupling conductive structures together within display 14. For example, tools 116 may be used to compress bonding material 92 (e.g., anisotropic conductive film) between flexible printed circuit 94 and pads 90. Equipment 118 may include soldering equipment such as a reflow oven or hot bar to heat solder paste on a printed circuit sufficiently to melt the solder and thereby attach an electrical component to that printed circuit and/or to join flexible printed circuit 94 to pads 90. Soldering equipment (e.g., a hot bar) may also be used in forming solder connections between interconnect lines in respective overlapping printed circuits (e.g. printed circuits 94 and 106).

Lasers 120 may be used to supply light at infrared wavelengths, visible wavelengths, and/or ultraviolet light wavelengths. Lasers 120 may include pulsed lasers and/or continuous wave lasers. Laser light from lasers 120 may be used for cutting, drilling, soldering, welding, and otherwise manipulating structures 110. With one suitable arrangement, laser 120 may produce laser light (e.g., ultraviolet light or other light) that is used in releasing a substrate layer and other display structures from a temporary support structure such as a temporary glass substrate layer.

An illustrative technique for forming display 14 is shown in FIGS. 7, 8, 9, 10, and 11.

Figure 7:
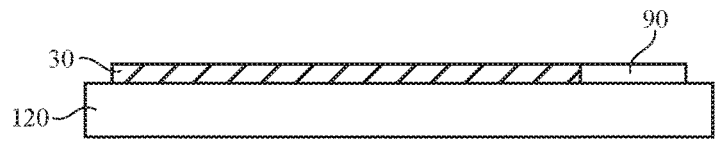
FIGS. 7, 8, 9, 10, and 11 show illustrative steps for forming a display with vias and in coupling the display to display driver circuitry in accordance with an embodiment.

As shown in FIG. 7, substrate layer 30 and metal bond pads 90 (sometimes referred to as pads or contacts) may initially be formed on a temporary support structure such as glass layer 120 or a temporary substrate formed from other materials. Substrate layer 30 may be deposited and patterned on layer 120 before metal bonds pads 90 or metal bond pads 90 may be formed on layer 120 before forming substrate layer 30. Metal bond pads 90 may be formed in openings in layer 30.

Figure 8:
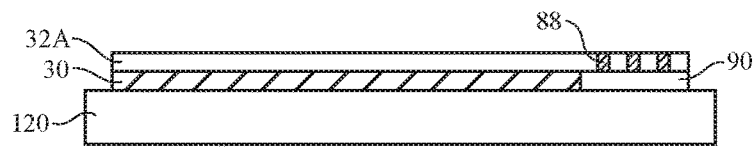

After forming substrate layer 30 and pads 90, layer 32A (e.g., a polymer layer such as a polyimide layer) may be deposited on layer 30. As shown in FIG. 8, vias 88 may then be formed in layer 32A. Openings for vias 88 may be formed by using laser etching, by photolithography (e.g., by forming layer 32A from a photoimageable polymer and/or by forming an etch mask using photolithography followed by a global etch process), by mechanical drilling, by applying localized heat or other energy, etc. Conductive material such as metal may be formed within via openings using physical vapor deposition (e.g., sputtering or evaporation through a shadow mask, sputtering or evaporation of blanket metal films followed by photolithographic etching), electroplating, chemical vapor deposition, printing of conductive liquid materials followed by curing, or other conductive material deposition techniques.

Figure 9:
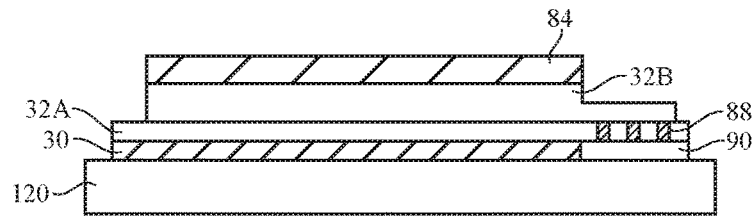
Figure 10:
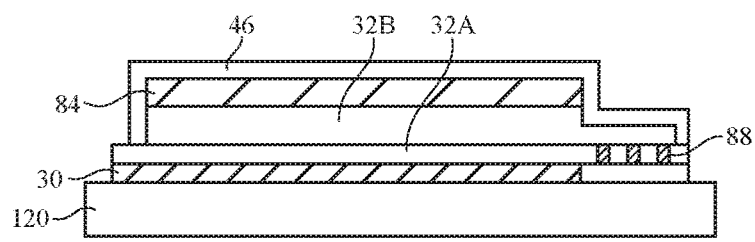

After forming vias 88, thin-film transistor circuitry 32B and organic light-emitting diode layer 84 may be deposited on layer 32A (FIG. 9). Encapsulation layer 46 may then be deposited to encapsulate the organic materials and other structures of display 14 (FIG. 10).

Display 14 may be removed from temporary substrate layer 120 by peeling layer 30 and pads 90 from layer 120. If desired, substrate 120 may be formed from a transparent material such as glass. With this type of arrangement, laser light (e.g., ultraviolet light or other laser light from laser 120 of FIG. 6) may be directed through substrate 120 in direction 122. The laser light may be absorbed by the layers of display 14 (e.g., layer 30) and may help release layer 30 from layer 120.

Figure 11:
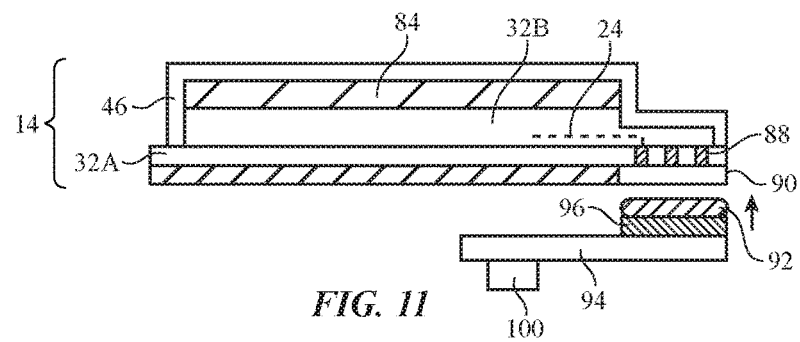

Following release of display 14 from layer 120, display driver circuitry 100 on printed circuit 94 and other support circuitry may be attached to pads 90 using bonding material 92, as shown in FIG. 11. Bonding material 92 may be attached to metal traces in printed circuit 94 such as contacts 96 in the example of FIG. 11. The metal in vias 88 may be connected to metal traces 74 in layer 32B such as gate lines G, data lines D, etc. The layers of display 14 that are shown in FIG. 11 may be attached to additional display layers (e.g., functional display layers 68 of FIG. 4, display cover layer 70 of FIG. 4, etc.).

If desired, vias may be formed through layer 30 from the backside of display 14. This type of approach for forming display 14 is shown in FIGS. 12, 13, 14, 15, and 16.

Figure 12:
FIGS. 12, 13, 14, 15, and 16 show illustrative steps in forming a display with vias using a backside bonding pad arrangement in accordance with an embodiment.

As shown in FIG. 12, substrate 30 may be formed on temporary layer 120.

Figure 13:
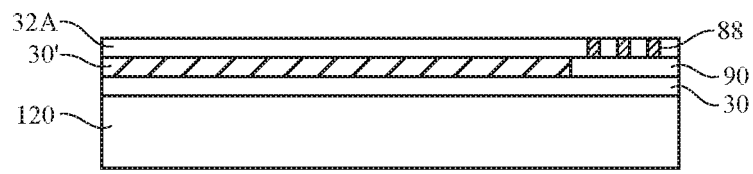

Following formation of layer 30, additional substrate layer 30' (e.g., an additional layer of polyimide or other polymer) and metal pads 90 may be formed on layer 30. Layer 32A and vias 88 through layer 32A may then be formed (FIG. 13). Vias 88 may contact pads 90.

Figure 14:
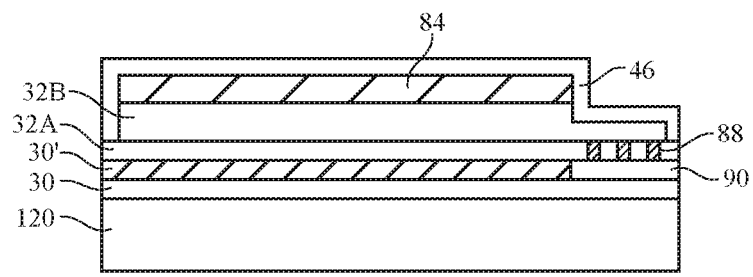

As shown in FIG. 14, layers 32B, 84, and 46 may then be formed on layer 32A.

Figure 15:
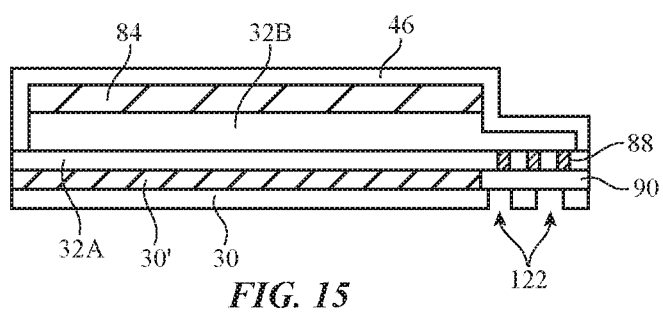
Figure 16:
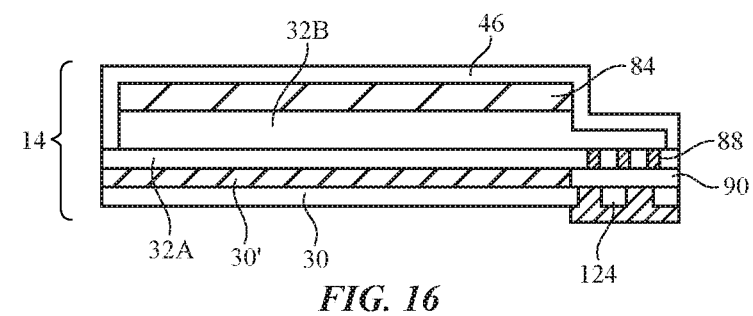

Layer 30 and the other layers of display 14 may be released from layer 120 by applying laser light to layer 30 through layer 120 or using other suitable debonding techniques (FIG. 15). Via openings for vias 122 may then be formed on the underside of layer 30. These vias may be filled with metal or other conductive material (e.g., conductive adhesive), as illustrated by metal pad 124 of FIG. 16. Pad 124 may be bonded to printed circuit 94 using bonding material 92 (e.g., solder, conductive adhesive, etc.), as shown by bonding material 92 of FIG. 11.

The illustrative configuration of FIGS. 17, 18, 19, 20, and 21, shows how display 14 may include vias that are filled with metal traces in layer 32A.

Figure 17:
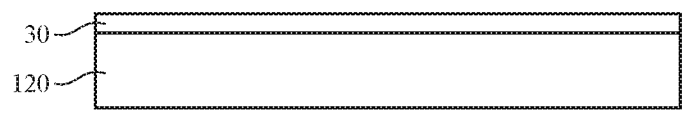
FIGS. 17, 18, 19, 20, and 21 show illustrative steps in forming a display with vias using an arrangement in which metal traces in a thin-film transistor layer have portions that extend into via openings in accordance with an embodiment.

Initially, substrate 30 may be formed on temporary layer 120 (FIG. 17).

Figure 18:

Openings for vias 126 may then be formed in substrate 30 (FIG. 18).

Figure 19:
Figure 20:
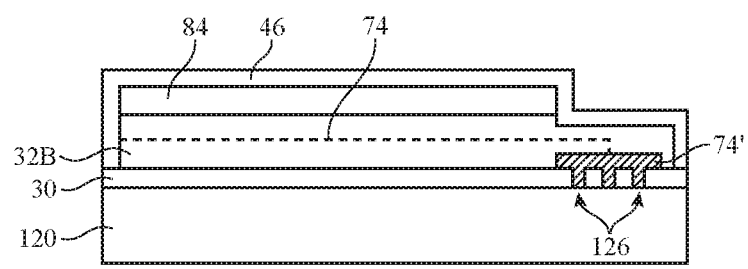

As shown in FIG. 19, metal 74' may be deposited and patterned on substrate layer 30, thereby filling vias 126 through layer 30. Layer 32B may be formed on layer 30. Metal 74' may be part of metal traces 74 in layer 32B or may be a separate metal layer that is coupled to metal traces 74. As shown in FIG. 20, metal in traces 74 in layer 32B may be coupled to metal in vias 126 by metal 74' on the surface of layer 30. Layer 32B and organic light-emitting diode layer 84 may be formed on layer 30 and may be encapsulated within layer 46. Following formation of the layers of FIG. 20, layer 30 and the other display layers of FIG. 20 may be released from layer 120 (e.g., using laser light application through layer 120, etc.).

Figure 21:
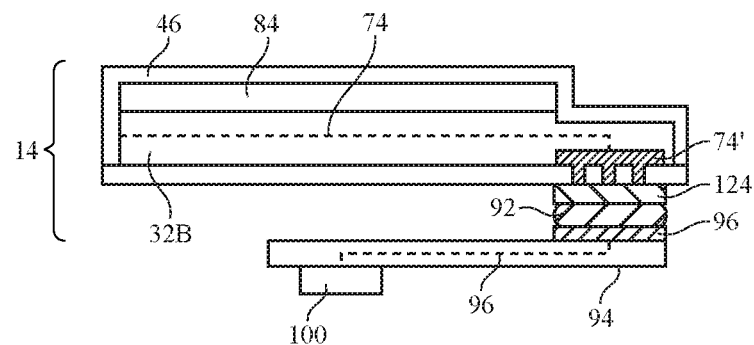

As shown in FIG. 21, following release from layer 120, display 14 may be coupled to display driver circuitry 100. In particular, a metal pad such as metal pad 124 may be formed on the lower surface of substrate 30 (e.g., pad 124 may be printed using a conductive liquid, may be deposited using physical vapor deposition followed by photolithographic patterning, etc.). With this type of arrangement, it is not necessary to form pads 90 on layer 120 nor is it necessary to release pads 90 from layer 120. Following formation of pad 124, pad 96 or other metal traces in printed circuit 94 may be attached to pad 124 using conductive bonding material 92. In this way, display driver circuitry 100 may be mounted under the active area of display 14.

Figure 22:
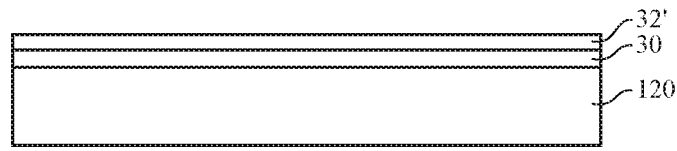
FIGS. 22, 23, and 24 show illustrative steps in forming a display with vias in a configuration in which vias pass through a substrate layer and one or more inorganic layers or other layers in a thin-film transistor layer in accordance with an embodiment.
Figure 23:
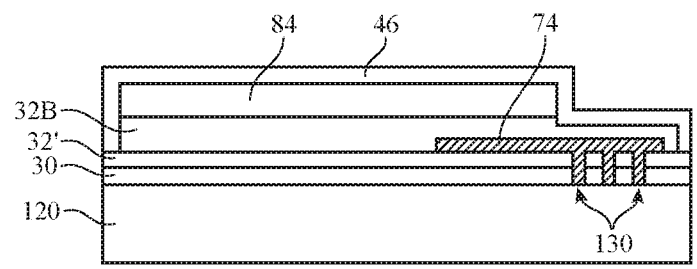
Figure 24:
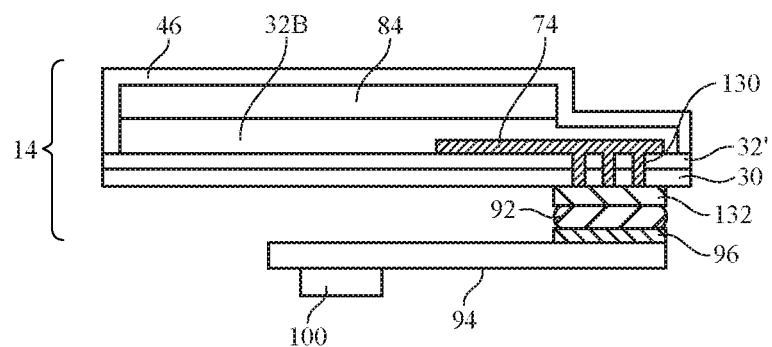

Another illustrative approach for forming display 14 is shown in FIGS. 22, 23, and 24.

Initially, substrate layer 30 and additional layers 32' may be formed on support layer 120, as shown in FIG. 22. Additional layers 32' may include inorganic layers for circuitry 32 such as buffer layers (silicon nitride layers, silicon oxide layers, metal oxide layers, etc.). The inorganic layers may help block moisture and impurities. etc.

After forming layers 30 and 32', vias 130 may be formed in layers 30 and 32' and may be filled with metal from traces 74 in layer 32B. Layer 84 and layer 46 may then be formed on layer 32B, as shown in FIG. 23.

As shown in FIG. 24, metal pads 132 may be formed on the underside of layer 30 (e.g., by printing, physical vapor deposition and photolithography, etc.) and may contact vias 130 and other portions of metal traces 74. Bonding material 92 may be used to form a conductive connection between pad 132 and pad 96 on printed circuit 94. Printed circuit 94 and display driver circuitry 100 may be mounted under display 14 so that the active area of display 14 overlaps display driver circuitry 100.

Figure 25:
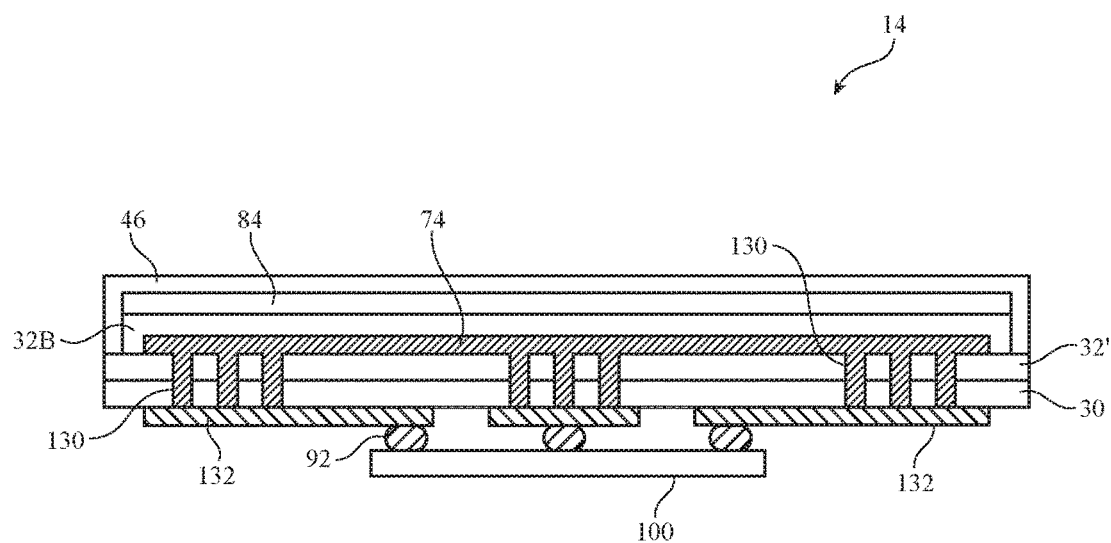
FIG. 25 is a cross-sectional side view of an illustrative display showing how driver circuitry may be coupled to signals paths in the display using vias that are formed throughout the active area of the display in accordance with an embodiment.

If desired, vertical signal paths between display driver circuitry 100 and metal traces 74 (e.g., gate lines G, data lines D, etc.) may be formed using vias that are located in active area AA of display 14. This type of approach, which is illustrated in the cross-sectional side view of FIG. 25, may allow the inactive borders of display 14 to be further minimized or eliminated. In the illustrative configuration of FIG. 25, display 14 includes vias 130 that have been formed from portions of metal traces 74 in layer 32B that pass through via openings in layers 32' and 30. Metal 132 on the rear surface of display 14 may, if desired, be patterned to form bond pads to bond with bonding material 92 and/or signal paths for distributing signals. Metal traces 74 may include data lines D, gate lines G, power supply lines, and other signal paths for powering and controlling pixels 22 in display 14. Vias 130 may be coupled to portions of metal traces 74 at intermediate locations along the lengths of lines D, lines G, power supply lines, and other paths in display 14, thereby minimizing or eliminating the need for forming connections between vias 130 and metal traces 74 along inactive border regions of display 14. Organic light-emitting diode layer 84 and encapsulation layer 46 cover layer 32B. Metal traces such as pads 132 on the underside of layer 30 may be coupled to display driver circuitry 100 using bonding material 92 or a printed circuit such as printed circuit 94 of FIG. 24 on which display driver circuitry 100 has been mounted may be coupled to pads 132 using bonding material 92.

Figure 26:
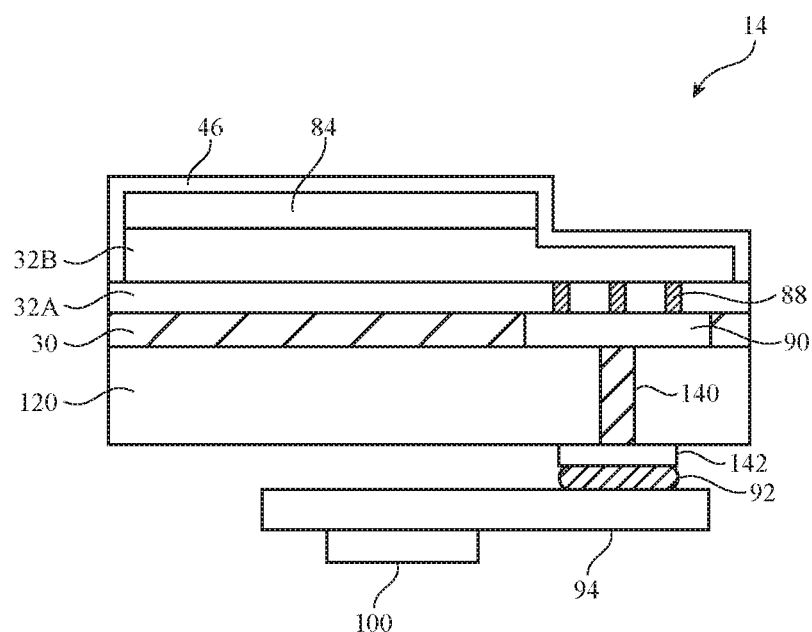
FIG. 26 is a cross-sectional side view of an illustrative display showing how vias may be formed through a rigid supporting substrate in accordance with an embodiment.

As shown in the illustrative cross-sectional side view of display 14 of FIG. 26, layer 120 may be used to provide support for substrate 30 in a completed display. Vias such as via 140 may be formed between pads 90 and corresponding pads 142 on the lower surface of layer 120. Vias 88 in layer 32A or other conductive structures may be used to couple pads 90 to metal traces 74 within layer 32B. Layer 32B may be covered with organic light-emitting diode layer 84 and encapsulant 46. Bonding material 92 may be used to mount display driver circuitry 100 on the rear surface of layer 120 or circuitry 100 may be coupled to pads 142 using printed circuit 94.

Figure 27:
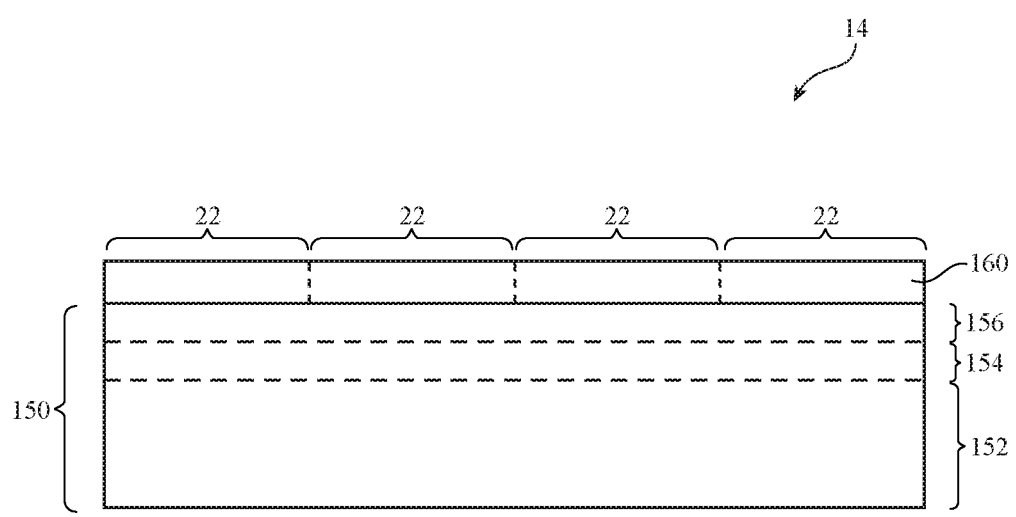
FIG. 27 is a cross-sectional side view of an illustrative display with minimized inactive borders formed from a silicon substrate covered with a layer of organic light-emitting diode pixels in accordance with an embodiment.

If desired, display 14 may be formed using a semiconductor substrate such as silicon substrate 150 of FIG. 27. Silicon substrate 150 may include bulk silicon layer 152, silicon transistor circuitry layer 154 formed on the upper surface of layer 152, and interlayer dielectric layer 156, which contains metal traces that form signal lines (interconnects) for the circuitry of layer 154. Layer 160 may include organic light-emitting diode layer 84 for forming an array of light-emitting diodes 26 for pixels 22. Layer 160 may also include optional thin-film transistor circuitry 44. Organic layer 84 and other structures in layer 160 may be protected by encapsulation layer 46. Circuitry 154 may include display driver circuitry for supplying data and control signals to the array of pixels 22 formed from layer 160, so inactive border regions for display 14 can be reduced or eliminated.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    a substrate;
    metal pads having opposing first and second surfaces;
    a polymer layer covering the substrate and the first surface of the metal pads, wherein vias in the polymer layer contact the first surface of metal pads;
    a thin-film transistor layer on the polymer layer, wherein metal traces in the thin-film transistor layer are coupled to the vias and provide signals to pixels configured to be controlled by transistors in the thin-film transistor layer; and
    bonding material on the second surfaces of the metal pads.

2. The display defined in claim 1 further comprising an organic light-emitting diode layer formed on the thin-film transistor layer, wherein the organic light-emitting diode layer forms an organic light-emitting diode for each of the pixels.

3. The display defined in claim 2 further comprising:
    a printed circuit; and
    display driver circuitry on the printed circuit, wherein the printed circuit has pads that are coupled to the bonding material.

4. The display defined in claim 3 wherein the bonding material comprises anisotropic conductive film.

5. The display defined in claim 1 wherein the substrate comprises a polymer.

6. A display, comprising:
    a first substrate having opposing first and second surfaces, wherein the first substrate comprises polymer;
    thin-film transistor layer on the first surface of the first substrate;
    an organic light-emitting diode layer on the thin-film transistor layer;
    an encapsulation layer on the organic light-emitting diode layer, wherein the first substrate includes via openings and wherein the thin-film transistor layer includes metal traces having portions in the via openings that form vias through the first substrate;
    a second substrate coupled to a first portion of the second surface of the first substrate;
    conductive pads on a second portion of the second surface of the first substrate that contact the vias through the first substrate, wherein the conductive pads are adjacent to the second substrate; and
    a flexible printed circuit board coupled to the conductive pads with conductive bonding material, wherein the conductive bonding material is interposed between the flexible printed circuit board and the conductive pads.

7. The display defined in claim 6 wherein the conductive pads comprise printed conductive pads, the display further comprising:
    display driver circuitry mounted on the printed circuit.

8. A display, comprising:
    a glass layer having opposing first and second surfaces and having vias that pass between the first and second surfaces;
    a polymer substrate formed on at least a first portion of the first surface;
    metal pads on at least a second portion of the first surface that contact the vias;
    a thin-film transistor layer on the polymer substrate;
    an organic light-emitting diode layer on the thin-film transistor layer; and
    an encapsulation layer on the organic light-emitting diode layer, wherein the thin-film transistor layer includes metal traces that are coupled to the metal pads.

9. The display defined in claim 8 further comprising:
    a polymer layer between the polymer substrate and the thin-film transistor layer;
    additional vias in the polymer layer that are coupled between the metal traces and the metal pads.

10. The display defined in claim 9 further comprising:
    metal contacts on the second surface of the glass layer that are coupled to the vias.

11. The display defined in claim 10 further comprising:
    a printed circuit that is coupled to the metal contacts; and
    display driver circuitry mounted on the printed circuit, wherein the printed circuit has signal paths that couple the display driver circuitry to the metal contacts.

* * * * *